(12) United States Patent
Wang et al.

(10) Patent No.: US 11,339,468 B2
(45) Date of Patent: May 24, 2022

(54) MAGNETRON SPUTTERING SCANNING METHOD FOR MODIFYING SILICON CARBIDE OPTICAL REFLECTOR SURFACE AND IMPROVING SURFACE PROFILE

(71) Applicant: Nanjing Institute of Astronomical Optics & Technology, National Astornomical Observatories, Chinese Academy of Sciences, Jiangsu (CN)

(72) Inventors: Jinfeng Wang, Jiangsu (CN); Meng Huang, Jiangsu (CN); Jie Tian, Jiangsu (CN); Yeru Wang, Jiangsu (CN)

(73) Assignee: NANJING INSTITUTE OF ASTRONOMICAL OPTICS & TECHNOLOGY, NATIONAL ASTORNOMICAL OBSERVATORIES, CHINESE ACADEMY OF SCIENCES, Jiangsu (CN)

( * ) Notice: Subject to any disclaimer, the term of this patent is extended or adjusted under 35 U.S.C. 154(b) by 0 days.

(21) Appl. No.: 16/757,819

(22) PCT Filed: Mar. 30, 2018

(86) PCT No.: PCT/CN2018/081213
§ 371 (c)(1),
(2) Date: Apr. 21, 2020

(87) PCT Pub. No.: WO2019/153462
PCT Pub. Date: Aug. 15, 2019

(65) Prior Publication Data
US 2020/0270745 A1 Aug. 27, 2020

(30) Foreign Application Priority Data
Feb. 12, 2018 (CN) .......................... 201810144019.1

(51) Int. Cl.
*C23C 14/35* (2006.01)
*C23C 14/02* (2006.01)
(Continued)

(52) U.S. Cl.
CPC ............ *C23C 14/35* (2013.01); *C23C 14/028* (2013.01); *C23C 14/14* (2013.01); *G02B 1/10* (2013.01)

(58) Field of Classification Search
CPC ....... C23C 14/35; C23C 14/028; C23C 14/14; C23C 14/588; C23C 14/185; G02B 1/10; G02B 1/08
See application file for complete search history.

(56) References Cited

U.S. PATENT DOCUMENTS

| | | | | | |
|---|---|---|---|---|---|
| 4,457,625 | A | * | 7/1984 | Greenleaf | G01B 11/245 356/511 |
| 4,533,449 | A | * | 8/1985 | Levenstein | C23C 14/547 204/192.13 |

(Continued)

FOREIGN PATENT DOCUMENTS

| CN | 101177779 | 5/2008 |
|---|---|---|
| CN | 101315435 | 12/2008 |

(Continued)

OTHER PUBLICATIONS

CN-101315435-A Translation (Year: 2008).*

(Continued)

*Primary Examiner* — Jennifer Wecker
*Assistant Examiner* — Patrick S Ott
(74) *Attorney, Agent, or Firm* — Rankin, Hill & Clark LLP

(57) ABSTRACT

A magnetron sputtering scanning method for manufacturing a silicon carbide optical reflector surface modification layer and improving surface profile includes (1) for a silicon (Continued)

carbide plane mirror to be modified, first utilizing diamond micro-powders to grind and roughly polish an aspherical silicon carbide reflector with a conventional polishing or CCOS numerical control machining method; (2) after the surface profile precision of the silicon carbide reflector satisfies a modification requirement, utilizing a strip-shaped magnetron sputtering source to deposit a compact silicon modification layer on the surface of the silicon carbide reflector; (3) then, utilizing a circular sputtering source to modify and improve the surface profile of the reflector; and (4) finally, finely polishing the modification layer, and achieving the requirements for machining the surface profile and roughness of the reflector.

5 Claims, 2 Drawing Sheets

(51) Int. Cl.
 *C23C 14/14* (2006.01)
 *G02B 1/10* (2015.01)

(56) References Cited

U.S. PATENT DOCUMENTS

| | | | | |
|---|---|---|---|---|
| 5,188,717 | A * | 2/1993 | Broadbent | C23C 14/3407 204/192.12 |
| 6,382,816 | B1 * | 5/2002 | Zhao | H01J 61/35 362/257 |
| 2002/0134671 | A1 * | 9/2002 | Demaray | C23C 14/35 204/192.25 |
| 2004/0165296 | A1 * | 8/2004 | Schaefer | G02B 5/0808 359/883 |
| 2004/0231973 | A1 * | 11/2004 | Sato | C23C 14/086 204/192.12 |
| 2004/0246610 | A1 * | 12/2004 | Tsuno | G02B 7/183 359/883 |
| 2007/0089983 | A1 * | 4/2007 | Plaisted | H01J 37/3455 204/298.01 |
| 2008/0099768 | A1 * | 5/2008 | Scarsbrook | H01L 29/1602 257/77 |
| 2009/0068503 | A1 | 3/2009 | Yamazaki | |
| 2010/0155225 | A1 * | 6/2010 | Oishi | H01J 37/32376 204/192.12 |
| 2012/0111724 | A1 * | 5/2012 | Kobayashi | H01J 37/3461 204/298.17 |
| 2012/0264020 | A1 | 10/2012 | Burton | |
| 2013/0199924 | A1 * | 8/2013 | Faley | C23C 14/35 204/192.12 |
| 2014/0008214 | A1 * | 1/2014 | Chen | C23C 14/3464 204/192.15 |
| 2015/0176117 | A1 * | 6/2015 | Fong | C23C 14/352 204/192.11 |
| 2016/0320534 | A1 * | 11/2016 | Dodson | G02B 5/0858 |

FOREIGN PATENT DOCUMENTS

| | | | |
|---|---|---|---|
| CN | 101315435 A | * 12/2008 | |
| EP | 2175298 A1 | * 4/2010 | G02B 7/182 |

OTHER PUBLICATIONS

EP-2175298-A1 Translation (Year: 2010).*
International Search Report filed in PCT/CN2018/081213 dated Nov. 16, 2018.

* cited by examiner

MAGNETRON SPUTTERING SCANNING METHOD FOR MODIFYING SILICON CARBIDE OPTICAL REFLECTOR SURFACE AND IMPROVING SURFACE PROFILE

TECHNICAL FIELD

The present invention relates to a process for machining and modifying a silicon carbide optical reflector, in particular to a magnetron sputtering scanning method for manufacturing a silicon carbide optical reflector surface modification layer and improving surface profile.

BACKGROUND

Silicon carbide material has a high specific rigidity, a small thermal deformation coefficient, a good heat conduction performance, a high thermal shock resistance, a high dimensional stability and an isotropic mechanical property, is a currently recognized optimum reflector material for a space optical system, and is extremely suitable to design and manufacture a space optical instrument.

Silicon carbide, as a ceramic material, also has inherent defects. On one hand, a silicon carbide surface is far less compact than a glass material; the roughness of a polished silicon carbide surface can only reach 3-4 nm due to the detects such as residual pores and the like, such that the technical indicator requirement that the surface roughness of a reflector of a high precision space optical system should be less than 1 nm cannot be satisfied. Furthermore, a rough optical surface would cause a large amount of light scattering, and would generate a great deal of stray light in an optical path while causing light energy loss; therefore, the imaging quality of the entire optical system would be reduced.

On the other hand, since the hardness and chemical stability of the silicon carbide are both high, the hardness close to diamond causes the problem that the polishing and grinding efficiencies are low. In order to obtain a high precision space reflector, generally a silicon carbide substrate is first machined to a certain precision; then, the surface thereof is modified, that is, the silicon carbide surface is coated with a compact modification layer to cover the defects on the silicon carbide surface while improving the machinability thereof; and finally, the modification layer on the silicon carbide surface is machined to obtain a high precision space reflector.

At present, the prior art has a problem in controlling the thickness of the silicon carbide reflector modification layer; the more the deformation amount of the substrate is under the action of a film layer stress, the thinner the modification layer is, and the easier the modification layer would be worn through during surface profile polishing of the substrate. The problem is caused by, in most cases, the mismatch between the precision of the substrate surface profile and the thickness of the modification layer, and the lack of experience of a polishing worker.

To solve the problem of the silicon carbide modification layer, the present invention provides a magnetron sputtering scanning method for modifying a silicon carbide reflector surface and improving surface profile, can modify the silicon carbide reflector surface while improving surface profile precision, and can solve the above problem and greatly improve the machining efficiency and quality.

SUMMARY OF THE INVENTION

The technical problem to be solved by the present invention is the rework problem which is easy to occur during silicon carbide modification layer machining. The present invention provides a magnetron sputtering scanning method capable of modifying a silicon carbide reflector surface while improving surface profile, can manufacture a silicon carbide reflector surface modification layer while improving surface profile, and can solve the above problem in the prior art, thus greatly improving the machining efficiency and quality.

The technical solution for completing the above task of the present invention is: a magnetron sputtering scanning method for manufacturing a silicon carbide optical reflector surface modification layer and improving surface profile, comprising the steps as follows:

(1) for a silicon carbide plane mirror to be modified (for example, with a caliber in 300 mm diameter), first utilizing diamond micro-powders to grind and roughly polish an aspherical silicon carbide reflector with a conventional polishing or CCOS numerical control machining method;

(2) After the surface profile precision of the silicon carbide reflector satisfies a modification requirement, utilizing a strip-shaped magnetron sputtering source to deposit a compact silicon modification layer on the surface of the silicon carbide reflector;

(3) Then, utilizing a circular sputtering source to modify and improve the surface profile of the reflector; and (4) Finally, finely polishing the modification layer, and achieving the requirements for machining the surface profile and roughness of the reflector.

Wherein the magnetron sputtering sources in steps (2) and (3) are respectively in a strip shape and a circular shape; the size of a long side of the strip-shaped sputtering source is greater than the caliber of the silicon carbide reflector surface to be modified, so as to facilitate the initial growth of the silicon carbide reflector surface modification layer; the target calibers of the circular sputtering source have a variety of specifications, such as 40 mm, 60 mm, 80 mm and the like, so as to match the silicon carbide reflectors in different calibers; a magnetic field structure of the circular sputtering source is optimized, such that the thicknesses of the manufactured modification layer are in a Gaussian distribution, so as to facilitate the surface profile improvement of the silicon carbide reflector surface.

The above solution can be further optimized as follows:

Before step (1), the silicon carbide reflector only needs to be primarily machined to $\lambda/10$, RMS ($\lambda$ refers to a detection wavelength 632.8 nm), and then surface modification and surface profile improvement can be performed.

The specific operations of step (2) are: first initially growing the silicon carbide reflector surface modification layer, and using the strip-shaped magnetron sputtering source in a reciprocative manner; a sputtering material is polycrystalline silicon, and the thickness of a film layer is 2 µm-6 µm, preferably 4 µm.

The specific operations of step (3) are: utilizing the circular sputtering source according to the height distribution situation (measured by an interferometer) of the surface profile of the silicon carbide reflector, setting, by a computer, a movement scanning trajectory of a circular silicon target on the surface of the silicon carbide reflector and residence time of the silicon target at different positions on the surface of a workpiece, and improving the surface profile of the silicon carbide reflector surface.

(4) Finally, finely smoothing and polishing the silicon modification layer, and achieving the purposes of reducing reflector surface roughness and improving the polishing efficiency.

With the above solution, the present invention has the following beneficial effects compared with the prior art:

The present invention provides a magnetron sputtering scanning method for modifying a silicon carbide reflector surface while improving surface profile, and solves the rework problem due to improper control of modification layer thickness during silicon carbide reflector surface machining.

(1) compared with the conventional silicon carbide reflector surface polishing process, the roughness thereof can only achieve 3-4 nm, and the time to polish one silicon carbide reflector surface is as long as 3-6 months. The roughness of the reflector surface manufactured with the method of the present invention can achieve 0.2-0.5 nm, and the time to polish one silicon carbide reflector surface can be reduced to 1.5-3 months.

(2) compared with an ion beam polishing process, the ion beam polishing process removes materials on the surface of a high precision optical element on the basis of a physical effect generated when low energy ions directly bombards an optical reflector surface; and the pre-machined reflector surface needs to achieve an extremely high surface profile precision. Therefore, the ion beam polishing technology has a low machining efficiency. The magnetron sputtering scanning method for modifying a silicon carbide reflector surface and improve surface profile provided by the present invention achieves the modification purpose by coating a structurally compact silicon modification layer on a silicon carbide substrate, and further satisfy a high roughness requirement by means of fine polishing. The modification method has a simple process, and remarkably improves machining efficiency and quality.

1 is a magnetron sputtering source system; 2 is a substrate baking system; 3 is a silicon carbide reflector clamping system; 4 is a vacuum chamber switching system; 5 is a three-dimensional motion system; and 6 is a strip-shaped magnetron sputtering target.

Figure 2:
Figure 2:
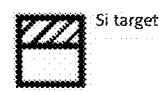
Figure 3:
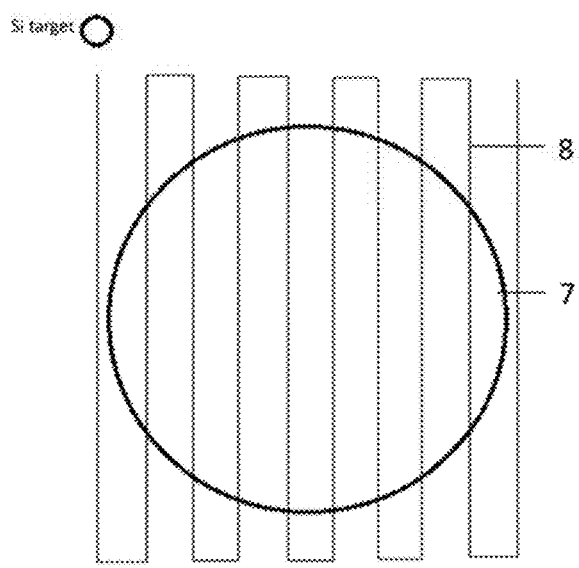

FIG. 2 is a schematic view of relative positions of a silicon carbide substrate and a silicon target;

FIG. 3 is a reference diagram of a movement trajectory of the silicon target on the silicon carbide substrate;

1 is a silicon carbide reflector; 2 is a movement trajectory of the silicon target.

Figure 4:
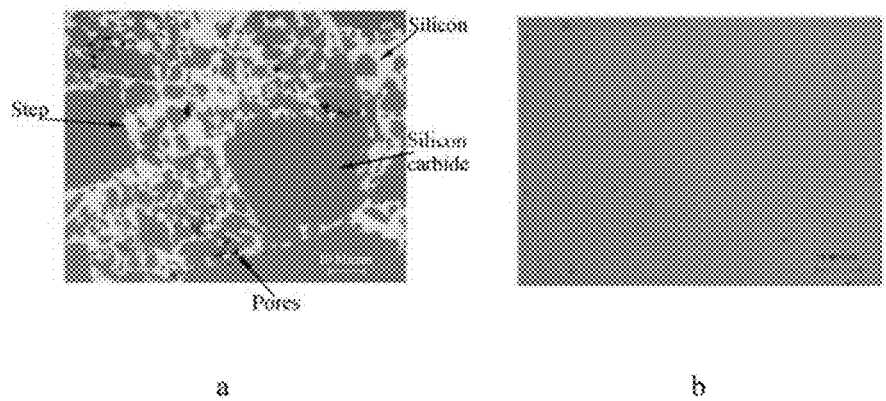

FIG. 4 is a reference diagram comparing the surface qualities of a silicon carbide sample reflector before and after the modification;

FIG. a is a microscope 500 times image before the modification; and FIG. b is a microscope 500 times image after the modification; it can be seen that a stepped structure is formed due to different removal rate during polishing.

Figure 5:
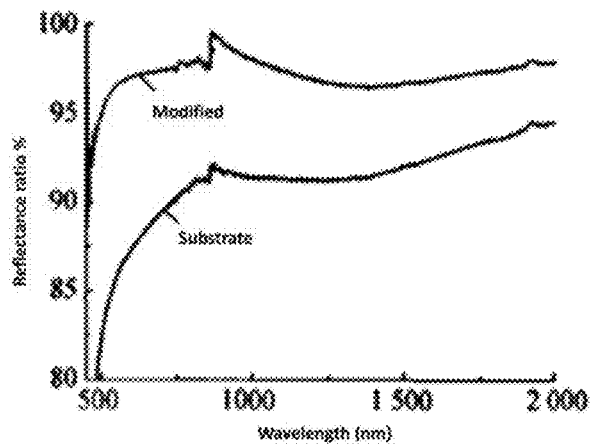

FIG. 5 is a reflectance ratio curve of the silicon carbide sample reflector before and after the modification.

DETAILED DESCRIPTION

The present invention will be further described hereafter in combination with the drawings and specific embodiments.

Embodiment

For a silicon carbide plane mirror to be modified with a caliber in 300 mm diameter, first utilizing diamond micro-powders to grind and roughly polish an aspherical silicon carbide reflector with a small polishing head numerical control machining method; after the surface profile precision of the silicon carbide reflector satisfies a modification requirement (the precision achieve $\lambda/10$, RMS), utilizing a strip-shaped magnetron sputtering source to deposit a compact 4 μm thick silicon modification layer on the surface of the silicon carbide reflector; then, utilizing a circular sputtering source to modify and improve the surface profile of the reflector; and finally, finely polishing the modification layer, and achieving the requirements for machining the surface profile and roughness of the reflector.

Figure 1:
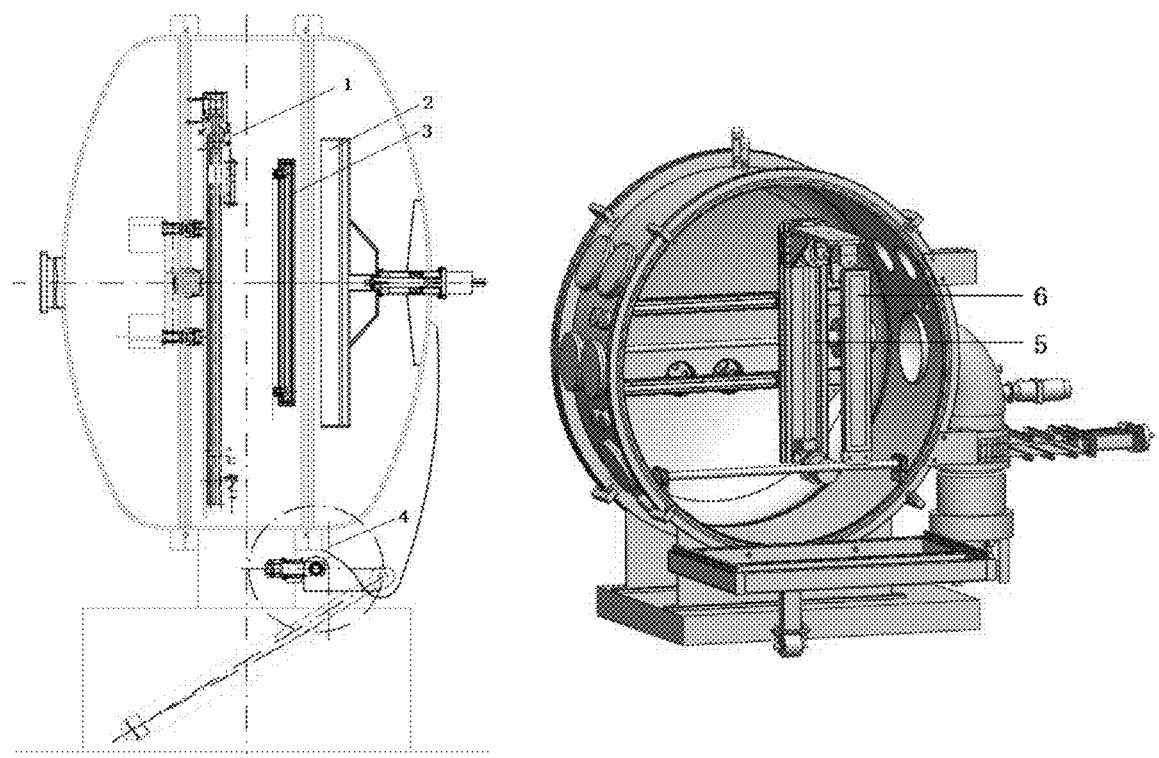
FIG. 1 is a schematic view of a magnetron sputtering scanning and coating device.

FIG. 1 is a schematic view of a magnetron sputtering scanning and coating device. After silicon carbide is clamped in a vacuum chamber, relative positions of a silicon target and a silicon carbide substrate are adjusted; a movement trajectory of the silicon target and residence time thereof on the surface of the silicon carbide are set by means of a computer program; and a compact silicon modification layer is deposited on the silicon carbide substrate.

FIG. 2 shows the relative positions of the silicon target and the silicon carbide substrate in the magnetron sputtering coating process. In the figure, the surface of the silicon carbide plane mirror substrate is ragged. A silicon modification layer is coated on the surface of the silicon carbide substrate with the circular magnetron sputtering source scanning method, so as to fill and level up low spots, thus enabling the silicon modification layer on the surface of the silicon carbide to be compact and uniform.

As shown in FIG. 3, in the coating process, a computer controls a movement trajectory of the silicon target on the surface of the silicon carbide, improves the ragged phenomenon of the silicon carbide substrate by controlling the residence time of the circular silicon target at different positions on the silicon carbide substrate, so as to improve the surface profile precision of the silicon carbide surface.

As shown in FIG. 4, after optical polishing, microstructures of the silicon carbide sample reflector before and after the modification can be viewed; it can be seen from the figure that the finely polished surface of the silicon carbide sample reflector before the modification still has a lot of defects, and is not compact enough. After a compact silicon modification layer is deposited on the surface of the silicon carbide with the magnetron sputtering method of the present invention, the finely polished silicon carbide surface almost has no defect, and the compact degree of the surface structure is greatly improved.

FIG. 5 is a reflectance ratio curve of the tested silicon carbide sample reflector before and after the modification. It can be clearly seen from the curve that the surface reflectance ratio of the modified silicon carbide sample reflector is obviously greatly improved.

The magnetron sputtering scanning method for modifying a silicon carbide reflector surface and improving surface profile provided by the present invention better solves the problem that the silicon carbide is hard to machine; furthermore, the method has a simple process, improves the surface profile precision of the reflector surface while modifying the reflector surface, and improves machining efficiency. The deposited silicon modification layer has a stable and compact structure, can satisfy a higher silicon carbide reflector surface roughness requirement after fine polishing, and can obtain a better quality silicon carbide reflector.

The invention claimed is:

1. A magnetron sputtering scanning method for manufacturing a silicon modification layer on a surface of an aspherical silicon carbide optical reflector and modifying a surface profile of the aspherical silicon carbide optical reflector, comprising:
(1) utilizing diamond micro-powders to grind and polish a surface of the aspherical silicon carbide optical reflector with a polishing or CCOS numerical control machining method;
(2) after the surface profile of the aspherical silicon carbide optical reflector satisfies a modification requirement, utilizing a strip-shaped silicon magnetron sputtering source to deposit the silicon modification layer on the surface of the aspherical silicon carbide optical reflector by moving the strip-shaped silicon magnetron sputtering source in a reciprocative manner;
(3) after step (2), utilizing a circular silicon magnetron sputtering source to deposit silicon directly on the silicon modification layer to modify the surface profile of the aspherical silicon carbide optical reflector by moving the circular silicon magnetron sputtering source to different positions on the aspherical silicon carbide optical reflector; and
(4) after step (3), polishing the silicon modification layer, and achieving requirements for machining the surface profile and roughness of the reflector.

2. The magnetron sputtering scanning method according to claim 1, wherein:
a size of a long side of the strip-shaped silicon magnetron sputtering source is greater than a caliber of the surface of the aspherical silicon carbide optical reflector to be modified, so as to facilitate the deposition of the silicon modification layer;
a target caliber of the circular silicon magnetron sputtering source is 40 mm, 60 mm or 80 mm, and a caliber of the aspherical silicon carbide optical reflector is 300 mm;
a magnetic field structure of the circular silicon magnetron sputtering source is optimized, such that thicknesses of the manufactured silicon modification layer are in a Gaussian distribution, so as to modify the surface profile of the aspherical silicon carbide optical reflector.

3. The magnetron sputtering scanning method according to claim 1, wherein before step (1), the surface of the aspherical silicon carbide optical reflector is machined to $\lambda/10$ (RMS), wherein $\lambda$ is a detection wavelength of 632.8 nm.

4. The magnetron sputtering scanning method according to claim 1, wherein:
a sputtering material for the strip-shaped silicon magnetron sputtering source and for the circular silicon magnetron sputtering source is polycrystalline silicon; and
a thickness of the silicon modification layer is 2 μm-6 μm.

5. The magnetron sputtering scanning method according to claim 1, wherein step (3) further includes:
utilizing the circular silicon magnetron sputtering source according to a height distribution situation of the surface profile of the aspherical silicon carbide optical reflector, and setting, by a computer,
i) a movement scanning trajectory of the circular silicon magnetron sputtering source on the surface of the aspherical silicon carbide optical reflector, and
ii) a residence time of the circular silicon magnetron sputtering source at different positions on the surface of the aspherical silicon carbide optical reflector, to thereby modify the surface profile of the aspherical silicon carbide optical reflector.

* * * * *